(12) United States Patent
Yin et al.

(10) Patent No.: US 8,946,613 B2
(45) Date of Patent: Feb. 3, 2015

(54) ULTRA LOW READOUT NOISE ARCHITECTURE HAVING A PIXEL SENSOR WITH DUAL ACTIVE PIXEL SENSOR PIXEL AND DUAL RAMP LINE

(71) Applicant: Himax Imaging, Inc., Grand Cayman (KY)

(72) Inventors: Ping Hung Yin, Irvine, CA (US); Amit Mittra, Irvine, CA (US); Kaveh Moazzami, Irvine, CA (US); Kwangoh Kim, Irvine, CA (US); Satya Narayan Mishra, Irvine, CA (US)

(73) Assignee: Himax Imaging, Inc., Grand Cayman (KY)

( * ) Notice: Subject to any disclaimer, the term of this patent is extended or adjusted under 35 U.S.C. 154(b) by 199 days.

(21) Appl. No.: 13/670,502

(22) Filed: Nov. 7, 2012

(65) Prior Publication Data

US 2014/0124648 A1    May 8, 2014

(51) Int. Cl.
*H01L 27/00* (2006.01)

(52) U.S. Cl.
USPC .................................. 250/208.1; 250/214 R

(58) Field of Classification Search
USPC ........ 250/208.1, 214 R, 214.1; 438/302–314; 257/290–292, 440
See application file for complete search history.

(56) References Cited

U.S. PATENT DOCUMENTS 6,818,933 B2 * 11/2004 Henderson et al. ........... 257/290
2008/0291072 A1   11/2008 Sano

OTHER PUBLICATIONS

Jeonghwan Lee et al., "A 10b Column-wise Two-step Single-slope ADC for High-speed CMOS Image Sensor", in Proceeding of Intl. Image Sensor Workshop, Jun. 7-10, 2007, pp. 196-199, Session 10 P37, IISS, Ogunquit Maine, USA.
Eric Delagnes et al., "A Low Power Multi-Channel Single Ramp ADC With up to 3.2 GHz Virtual Clock", Nuclear Science Symposium Conference Record, IEEE, 2006, pp. 231-238, vol. 1.
Antonio Oblea, "Design and Operation of Integrating ADCs", May 7, 2008, pp. 1-24, Boise State University.
Ricardo Gutierrez-Osuna, "Lecture 8: Data Acquisition II", Intelligent Sensor Systems, Jul. 20, 2004, pp. 1-18, Internet Archive Wayback Machine.
Tony R. Kuphaldt, "Slope (integrating) ADC", Lessons In Electric Circuits, vol. IV—Digital, Nov. 1, 2007, Fourth Edition, Chapter 13.8, pp. 422-425 [Also available at <URL: http://www.allaboutcircuits.com/vol_4/chpt_13/8.html>, retrieved from the internet on Nov. 27, 2012].

* cited by examiner

*Primary Examiner* — Que T Le
(74) *Attorney, Agent, or Firm* — SU IP Consulting

(57) ABSTRACT

A method to read out pixels includes reading a first pixel by resetting a first photodetector, integrating the first photodetector after resetting the first photodetector, resetting a first floating diffusion node coupled to the first photodetector and a second floating diffusion node coupled to a second photodetector, transferring charge from the first photodetector to the first floating diffusion node, comparing a first signal at the first floating diffusion node and a second signal at the second floating diffusion node and generating a first signal to latch a first counter value when the first signal is less than the second signal, incrementing the first signal and decrementing the second signal, and comparing the first signal and the second signal and generating a second signal to latch a second counter value when the first signal is greater than the second signal, wherein the difference between the second counter value and the first counter value indicates a first pixel level.

6 Claims, 6 Drawing Sheets

ULTRA LOW READOUT NOISE ARCHITECTURE HAVING A PIXEL SENSOR WITH DUAL ACTIVE PIXEL SENSOR PIXEL AND DUAL RAMP LINE

BACKGROUND

1. Field of the Invention

The present disclosure generally relates to complementary metal-oxide semiconductor (CMOS) image sensors.

2. Description of the Related Art

Unless otherwise indicated herein, the approaches described in this section are not prior art to the claims in this application and are not admitted to be prior art by inclusion in this section.

FIG. 1 is a block diagram of an image sensor 100. Image sensor 100 includes an active pixel sensor (APS) pixel 102, a correlated double sampling (CDS) circuit 104 coupled to the APS pixel, and an analog-to-digital converter (ADC) circuit 106 coupled to the CDS circuit.

APS pixel 102 includes a pinned photodetector 108. Photodetector 108 includes a P-type body 110, an N-type implant 112, and a shallow pinning P-type implant 114 that separates the N-type implant from the surface. A transfer gate 116 controls the charge transfer from photodetector 108 to a floating diffusion (FD) node 118. A reset transistor 120 is coupled to FD node 118 to reset photodetector 108 before and after charge is integrated. A source follower (SF) transistor 122 is coupled to FD node 118 to convert charge to output voltage.

CDS circuit 104 includes a sample and hold reset (SHR) transistor 124 coupled to the source of SF transistor 122 to transfer a reset signal to a SHR capacitor 126 for storage. A sample and hold signal (SHS) transistor 128 is coupled to the source of SF transistor 122 to transfer a charge signal to a SHS capacitor 130 for storage. An amplifier 132 has its negative and positive inputs coupled to SHR capacitor 126 and SHS capacitor 130, respectively. Amplifier 132 outputs a signal that is the difference between the charge signal and the reset signal to remove reset noise.

ADC circuit 106 includes a comparator 134 with a negative input coupled to a ramp generator 136 and a positive input coupled to the output of amplifier 132. The output of comparator 134 is coupled to a latch 138 so the latch stores the value of a counter 140 when the signal from ramp generator 136 becomes larger than the signal from amplifier 132.

SUMMARY

In one or more embodiments of the present disclosure, a method to read out pixels includes reading a first pixel by resetting a first photodetector, integrating the first photodetector after resetting the first photodetector, resetting a first floating diffusion node coupled to the first photodetector and a second floating diffusion node coupled to a second photodetector, transferring charge from the first photodetector to the first floating diffusion node, comparing a first signal at the first floating diffusion node and a second signal at the second floating diffusion node and generating a first signal to latch a first counter value when the first signal is less than the second signal, incrementing the first signal and decrementing the second signal, and comparing the first signal and the second signal and generating a second signal to latch a second counter value when the first signal is greater than the second signal, wherein the difference between the second counter value and the first counter value indicates a first pixel level.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are therefore not to be considered limiting of its scope, the disclosure will be described with additional specificity and detail through use of the accompanying drawings.

In the drawings.

DETAILED DESCRIPTION

Figure 2:
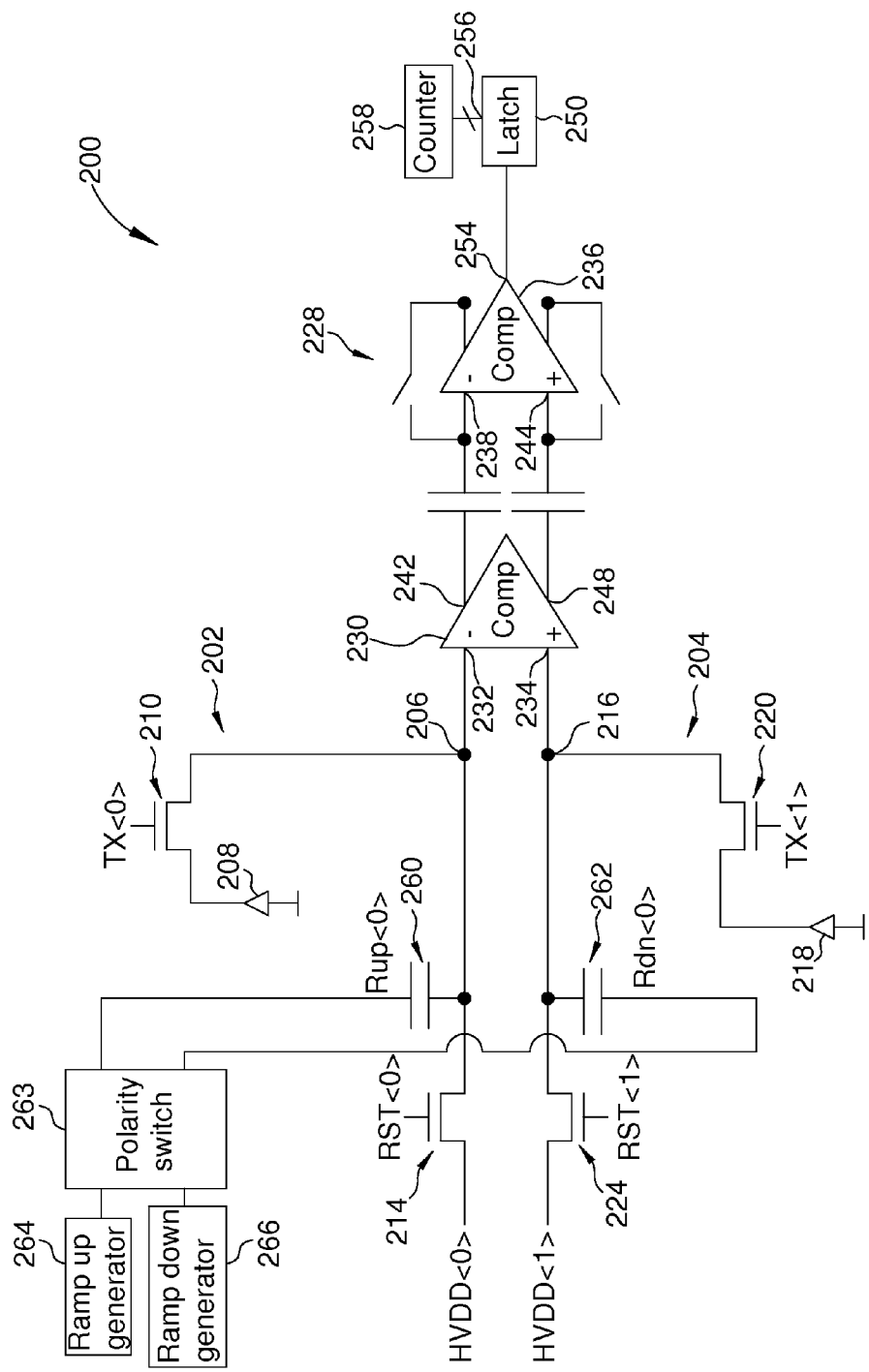
FIG. 2 is a block diagram of an image sensor with a pair of pixels.

FIG. 2 is a block diagram of an exemplary image sensor 200 in one or more embodiments of the present disclosure. Image sensor 200 includes a pair of active pixel sensor (APS) pixels 202 and 204 that are read in a collaborative manner where correlated double sampling (CDS) and analog-to-digital (ADC) timing are shared. Although only one pair of pixels is shown in sensor 200, the general concept described herein may be applied to multiple pairs of pixels forming an array of pixels.

First APS pixel 202 includes a first floating diffusion (FD) node 206, a first photodetector 208, a first transfer transistor 210 that couples the first photodetector to the first FD node, a ramp up line Rup<0> coupled to the first FD node, and a first reset transistor 214 coupling a first supply line HVDD<0> to the first FD node. Specifically, first transfer transistor 210 has its source coupled to the cathode of first photodetector 208 and its drain coupled to first FD node 206. First transfer transistor 210 has its gate connected to a first transfer line TX<0>, which controls the charge transfer from first photodetector 208 to first FD node 206. First reset transistor 214 has its drain coupled to first supply line HVDD<0> and its source coupled to first FD node 206. First reset transistor 214 has its gate connected to a first reset line RST<0>, which controls the reset of first photodetector 208 and/or first FD node 206. Although not shown, first APS pixel 202 includes a first source follower (SF) transistor with near unity gain (0.9) that converts the charge at first FD node 206 to an output voltage.

Ramp up line Rup<0> supplies a signal that ramps up a transferred charge signal, which is compared with a reference signal that is ramped down to determine a digital level of APS pixel 202 as described later. Ramp up line Rup<0> also supplies a signal that ramps down a reference signal, which is compared with a transferred charge signal that is ramped up to determine a digital level of APS pixel 204 as described later. Ramp up line Rup<0> is placed adjacent to but insulated from first FD node 206 so the ramp up line is capacitively coupled to the first FD node. This capacitive coupling is represented by a capacitor 260 between ramp up line Rup<0> and first FD node 206. Image sensor 200 includes a polarity reversing switch 263 that couples a positive ramp generator 264 to ramp up line Rup<0> and a negative ramp generator 266 to ramp down line Rdn<0>, and vise versa.

Second APS pixel 204 includes a second FD node 216, a second photodetector 218, a second transfer transistor 220 that couples the second photodetector to the second FD node, a ramp down line Rdn<0> coupled to the second FD node, and a second reset transistor 222 coupling a second supply line HVDD<1> to the second FD node. Specifically, second transfer transistor 220 has its source coupled to the cathode of second photodetector 218 and its drain coupled to second FD node 216. Second transfer transistor 220 has its gate coupled to a second transfer line TX<1>, which controls the charge transfer from second photodetector 218 to second FD node 216. Second reset transistor 224 has its drain coupled to second supply line HVDD<1> and its source coupled to second FD node 216. Second reset transistor 224 has its gate coupled to a second reset line RST<1>, which controls the reset of second photodetector 218 and/or second FD node 216. Although not shown, second APS pixel 204 includes a second SF transistor with near unity gain (e.g., 0.9) that converts the charge at second FD node 216 to an output voltage.

Ramp down line Rdn<0> supplies a signal that ramps down a reference signal, which is compared with a transferred charge signal that is ramped up to determine a digital level of APS pixel 202 as described later. Ramp down line Rdn<0> also supplies a signal that ramps up a transferred charge signal, which is compared with a reference signal that is ramped down to determine a digital level of APS pixel 204 as described later. Ramp down line Rdn<0> is placed adjacent to but insulated from second DF node 216 so the ramp down line is capacitively coupled to the second FD node. This capacitive coupling is represented by a capacitor 262 between ramp down line Rdn<0> and second FD node 216. As introduced above, polarity reversing switch 263 couples positive ramp generator 264 to ramp up line Rup<0> and negative ramp generator 266 to ramp down line Rdn<0>, and vise versa.

Image sensor 200 includes a readout circuit 228 having one or more stages. Readout circuit 228 includes a first stage with a first comparator 230 having its negative input 232 coupled by the first SF transistor (not shown) to first FD node 206 and its positive input 234 coupled by the second SF transistor (not shown) to second FD node 216. APS pixels 202 and 204 may be collaboratively read using CDS. When reading first APS pixel 202, the transferred charge signal from first photodetector 208 at first FD node 206 is compared with a reference signal at second FD node 216 that has been reset. When reading second APS pixel 204, the transferred charge signal from second photodetector 218 at second FD node 216 is compared with a reference signal at first FD node 206 that has been reset.

Readout circuit 228 may include a second stage with a second comparator 236 having its negative input 238 coupled by a capacitor 240 to a negative output 242 of first comparator 230, and its positive input 244 coupled by a capacitor 246 to a positive output 248 of the first comparator.

Readout circuit 228 includes a latch 250 having its control input 252 coupled to an output 254 of second comparator 236, and its data input 256 coupled to a counter 258.

Figure 3:
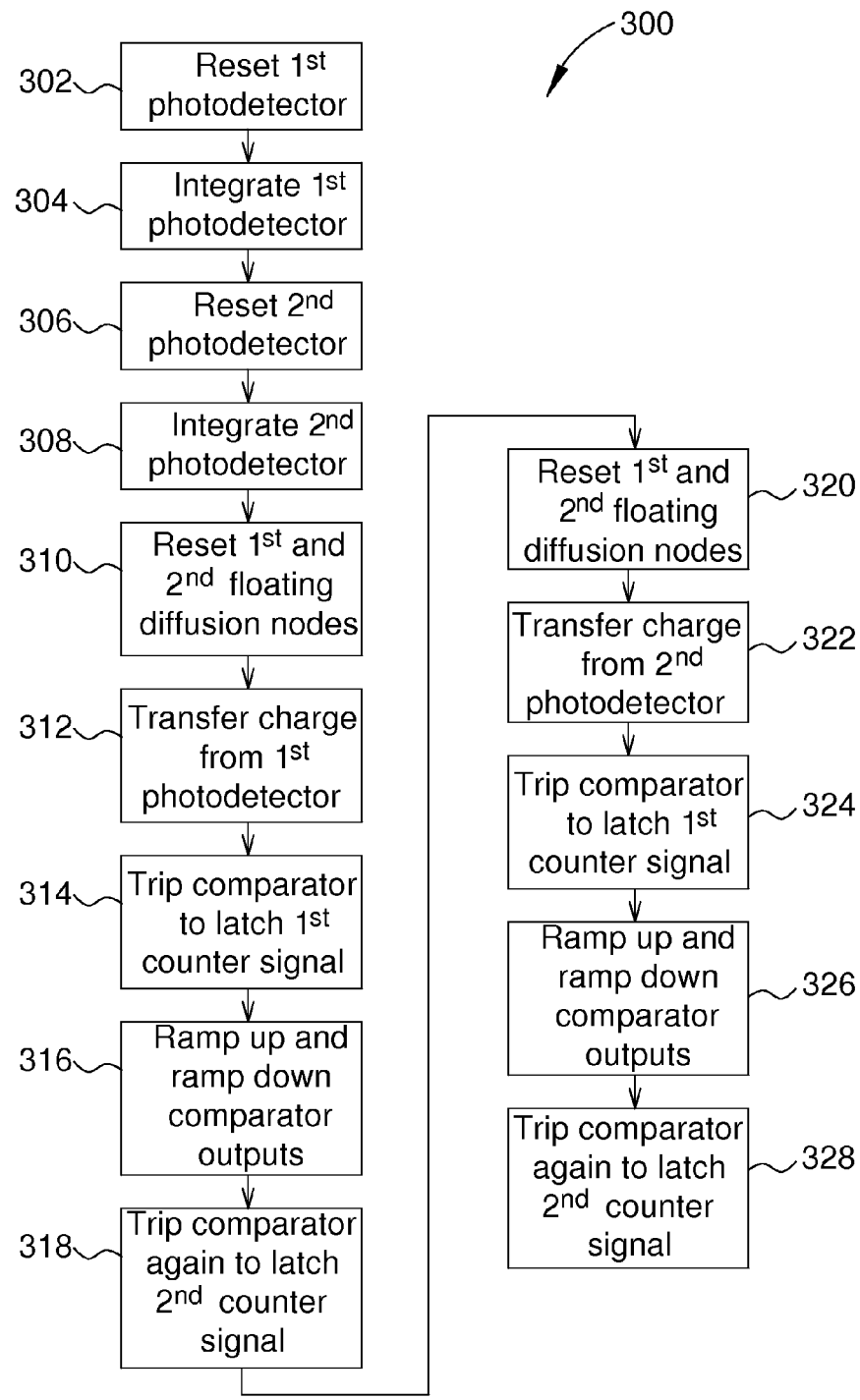
FIG. 3 is a flowchart of a method to read out a pair of pixels in the pixel sensor of FIG. 2.
Figure 4:
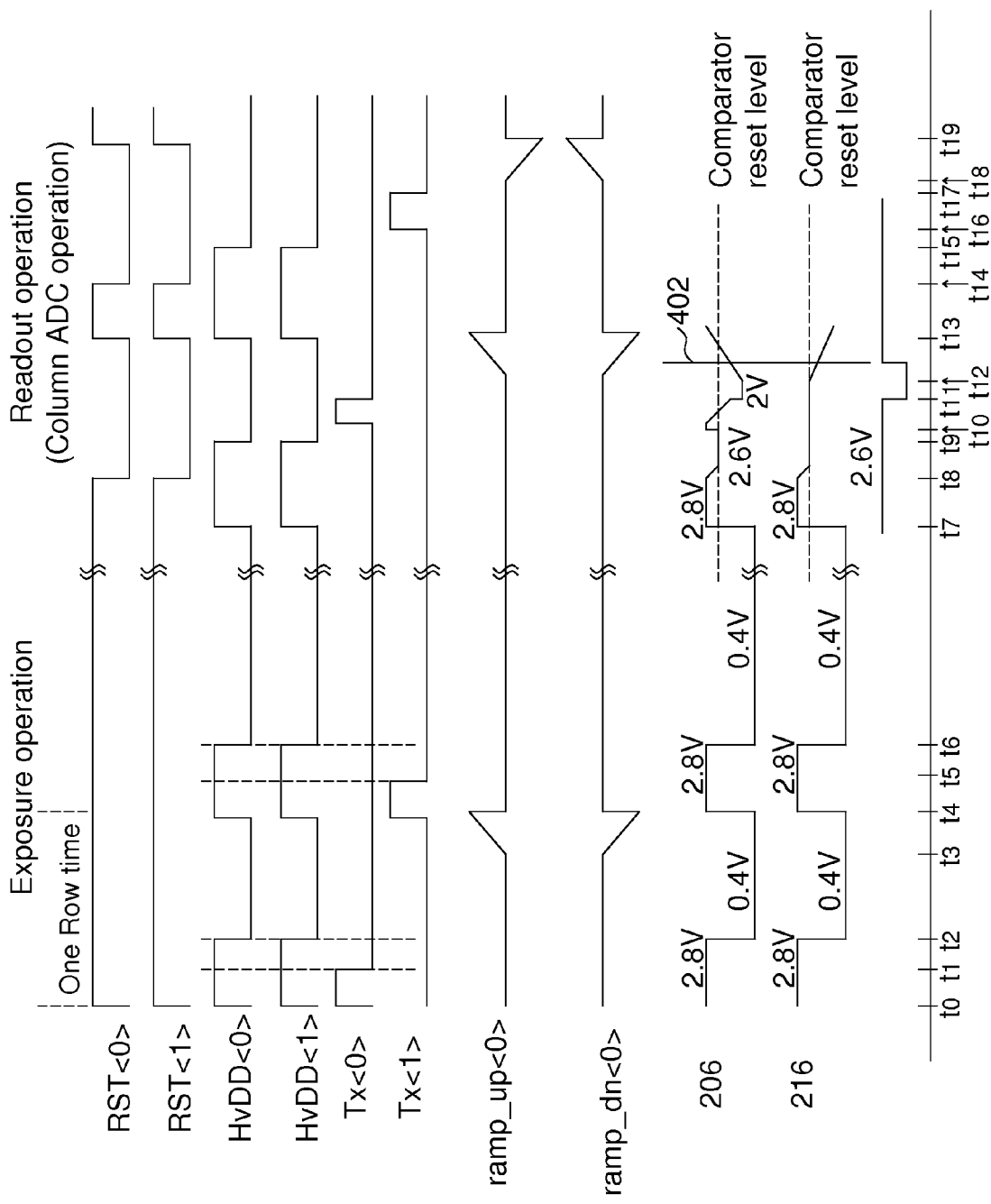
FIG. 4 is a timing diagram for the method of FIG. 3.

FIG. 3 is a flowchart of an exemplary method to 300 to read out pixels in image sensor 200 (FIG. 2) in one or more embodiments of the present disclosure. FIG. 4 is a timing diagram 400 for reading out pixels in image sensor 200 using method 300 in one or more embodiments of the present disclosure. Method 300 may include one or more operations, functions, or actions illustrated by one or more blocks. Although the blocks are illustrated in sequential orders, these blocks may also be performed in parallel, and/or in a different order than those described herein. Also, the various blocks may be combined into fewer blocks, divided into additional blocks, and/or eliminated based upon the desired implementation. Method 300 may begin in a block 302.

In block 302, first photodetector 208 is reset at time t0 by driving lines RST<0>, HVDD<0>, and TX<0> high at time t0. Line TX<0> stays high until time t1, and line HVDD<0> stays high until time t2 (t2>t1) to ensure first photodetector 208 is fully reset. Line RST<0> may stay high until time t8. Note that line RST<1> is also driven high at t0 and stays high until time t8. Block 302 may be followed by block 304.

In block 304, first photodetector 208 is integrated by exposing it to light for a predetermined exposure time. Block 304 may be followed by bock 306.

In block 306, second photodetector 218 is reset at time t4 by maintaining line RST<1> high and driving lines HVDD<1> and TX<1> high at time t4. Line TX<1> stays high until time t5, and line HVDD<1> stays high until time t6 (t6>t5) to ensure second photodetector 218 is fully reset. Line RST<1> may remain high until time t8. Block 306 may be followed by block 308.

In block 308, second photodetector 218 is integrated by exposing it to light for the predetermined exposure time. Block 308 may be followed by bock 310.

In blocks 310 to 318, first APS pixel 202 is read out. In block 310, first FD node 206 and second FD node 216 are reset at time t7 by maintaining lines RST<0> and RST<1> high and driving lines HVDD<0> and HVDD<1> high at time t7. Lines RST<0> and RST<1> are returned to low at time t8. Lines HVDD<0> and HVDD<1> are returned to low at time t9 (t9>t8) to ensure first FD node 206 and second FD node 216 are fully reset. During time t7 to t9, lines TX<0> and TX<1> are maintained low to isolate first FD node 206 and second FD node 216 from first photodetector 208 and second photodetector 218, respectively. Note that turning off first reset transistor 214 and second reset transistor 224 during the reset of first FD node 206 and second FD node 216 introduces charge injection and clock feedthrough at time t8. Block 310 may be followed by block 312.

In block 312, charge from first photodetector 208 is transferred to first FD node 206 by driving line TX<0> high from time t10 to t11. Note that turning on and off first transfer transistor 210 during the charge transfer introduces charge injection and clock feedthrough at times t10 and t11. Block 312 may be followed by block 314.

In block 314, first comparator 230 trips at time t11 when a first signal (e.g., a first voltage) at negative input 232 is less than a second signal (e.g., a second voltage) at positive input 234, which causes second comparator 236 to trip and generate a first latch signal that causes latch 250 to capture a first counter value from counter 258. Block 314 may be followed by block 316.

In block 316, from time t12 to t13, positive ramp generator 264 ramps up line Rup<0> to increment the first voltage at negative input 232 of first comparator 230, and negative ramp generator 266 ramps down line Rdn<0> to decrement the second voltage at positive input 234 of the first comparator. As described above, polarity switch 263 is used to provide the proper connection between generators 264, 266 and lines Rup<0>, Rdn<0>. Block 316 may be followed by block 318.

In block 318, first comparator 230 trips again (indicated by reference number 402 in FIG. 4) when the first voltage at negative input 232 is greater than the second voltage at positive input 234, which causes second comparator 236 to trip again and generate a second latch signal that causes latch 250 to capture a second counter value from counter 258. The difference between the second counter value and the first counter value indicates a digital value of first APS pixel 202. Block 318 may be followed by block 320.

In blocks 320 to 328, second APS pixel 204 is read out. In block 320, first FD node 206 and second FD node 216 are reset at time t13 by driving lines RST<0>, RST<1>, HVDD<0>, and HVDD<1> high. Lines RST<0> and RST<1> are returned to low at time t14. Lines HVDD<0> and HVDD<1> are returned to low at time t15 (t15>t14) to ensure first FD node 206 and second FD node 216 are fully reset. During time t13 to t15, lines TX<0> and TX<1> are maintained low to isolate first FD node 206 and second FD node 216 from first photodetector 208 and second photodetector 218, respectively. Block 320 may be followed by block 322.

In block 322, charge from second photodetector 218 is transferred to second FD node 216 by driving line TX<1> high from time t16 to t17. Block 322 may be followed by block 324.

In block 324, first comparator 230 trips when the first voltage at negative input 232 is higher than the second voltage at positive input 234, which causes second comparator 236 to trip and generate a third latch signal that causes latch 256 to capture a third counter value from counter 258. Block 324 may be followed by block 326.

In block 326, from time t18 to t19, positive ramp generator 264 ramps up line Rdn<0> to increment the second voltage at positive input 234 of first comparator 230, and negative ramp generator 266 ramps down line Rup<0> to decrement the first voltage at negative input 232 of the first comparator. As described above, polarity switch 263 is used to provide the proper connection between generators 264, 266 and lines Rup<0>, Rdn<0>. Block 326 may be followed by block 328.

In block 328, first comparator 230 trips again when the first voltage at negative input 232 is lower than the second voltage at positive input 234, which causes second comparator 236 to trip again and generate a fourth latch signal that causes latch 250 to capture a fourth counter value from counter 258. The difference between the fourth counter value and the third counter value indicates a digital value of second APS pixel 204.

Figure 1:
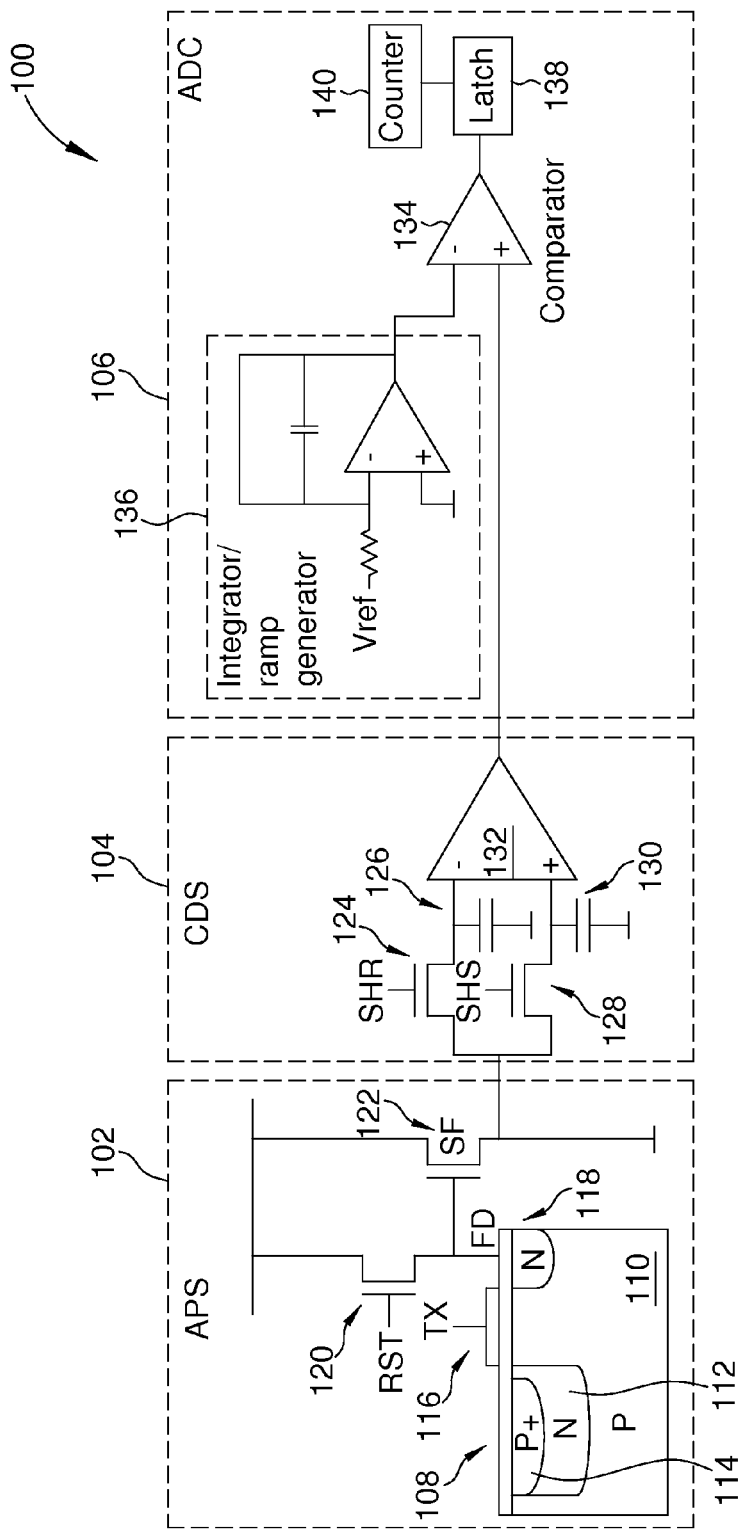
FIG. 1 is a block diagram of an image sensor.

As described above, image sensor 200 (FIG. 2) of the present disclosure provide low readout noise compared to image sensor 100 (FIG. 1). Image sensor 200 does not employ any sampling and hold circuit and operation, thereby eliminating a source of kTC reset noise. Image sensor 200 also does not amplify signals with operational amplifier or source follower transistor, thereby eliminating another source of noise.

Figure 5:
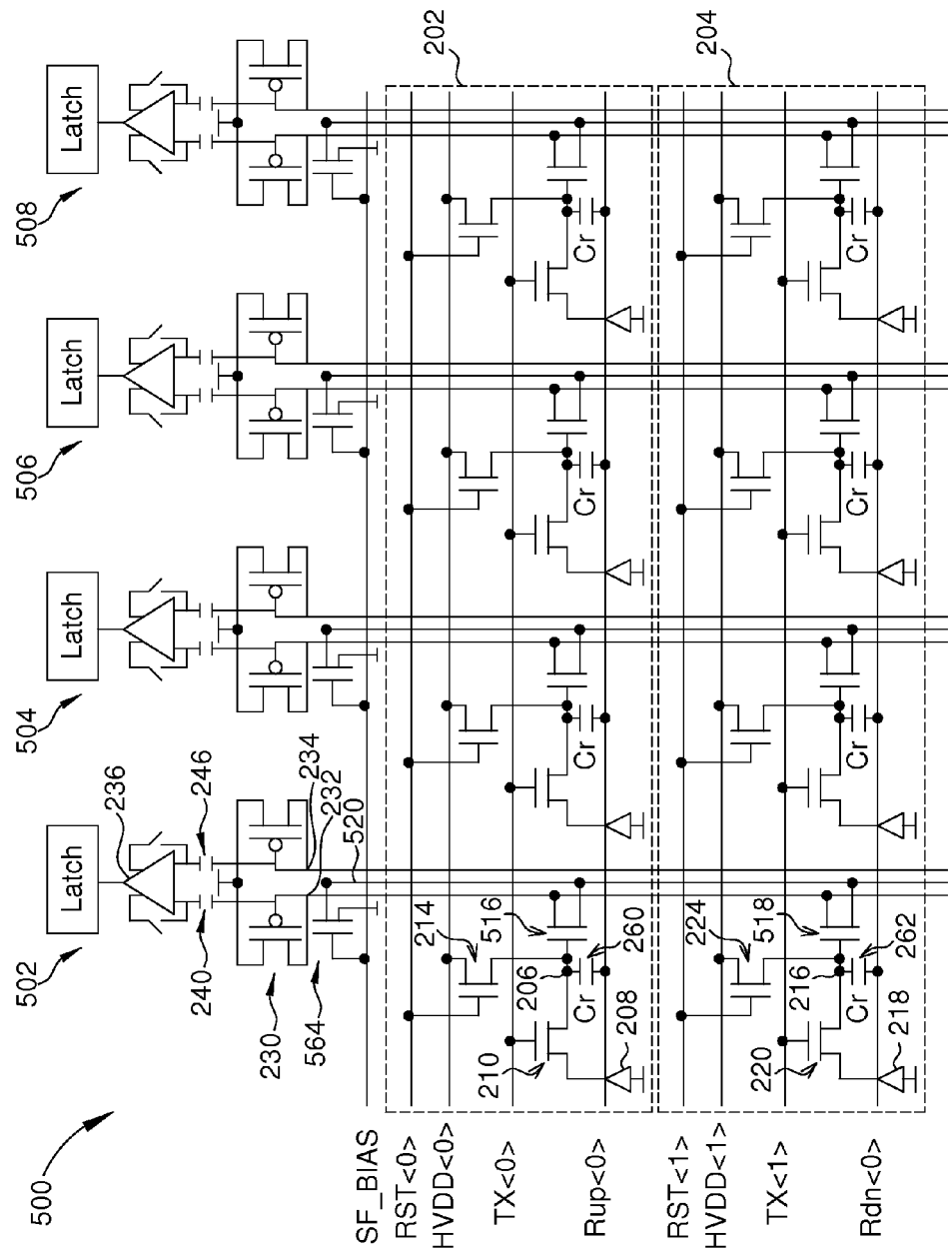
FIGS. 5 and 6 combine to form a block diagram of an image sensor with multiple pairs of pixels, all arranged in accordance with at least some embodiments of the present disclosure.
Figure 6:
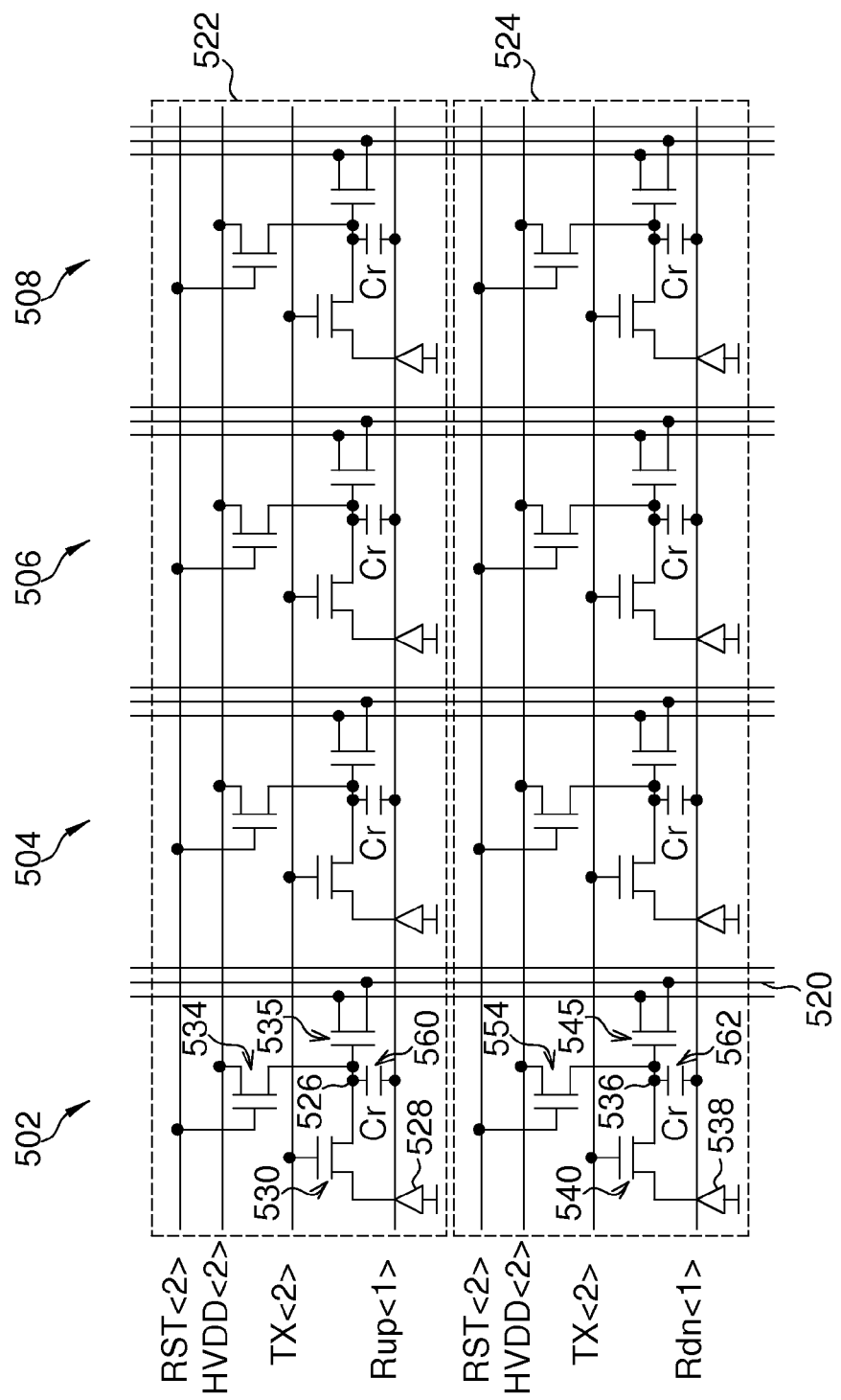

FIGS. 5 and 6 combine to form a block diagram of an exemplary image sensor 500 in one or more embodiments of the present disclosure. Image sensor 500 applies the concept of image sensor 200 (FIG. 2) to four pairs of APS pixels arranged in a four by four pixel array.

The pixels in image sensor 500 are arranged in four columns 502, 504, 506, and 508. Each column has two pairs of pixels and each pair is collaboratively read out in the manner described above for APS pixels 202 and 204 (FIG. 2) in image sensor 200 (FIG. 2).

Column 502 includes a first pair of APS pixels 202 and 204. Shown in more detail, first APS pixel 202 includes a first SF transistor 516 that couples first FD node 206 to negative input 232 of comparator 230, and second APS pixel 204 includes a second SF transistor 518 that couples second FD node 216 to positive input 234 of comparator 230. SF transistors 516 and 518 form an input pair for comparator 230. Specifically, first SF transistor 516 has its gate coupled to first FD node 206, its source coupled to negative input 232 of comparator 230, and its drain coupled to a bias line 520. Second SF transistor 518 has its gate coupled to second FD node 216, its source coupled to positive input 244 of comparator 230, and its drain coupled to bias line 520.

Column 502 further includes a second pair of APS pixels 522 and 524 that are read in the same manner described the first pair of APS pixels 202 and 204.

Third APS pixel 522 includes a third FD node 526, a third photodetector 528, a third transfer transistor 530 that couples the third photodetector to the third FD node, a ramp up line Rup<1> coupled to the third FD node, a third reset transistor 534 coupling a third supply line HVDD<2> to the third FD node, and a third SF transistor 535 that couples the third FD node to negative input 232 of comparator 230. Specifically, third transfer transistor 530 has its source coupled to the cathode of third photodetector 528 and its drain coupled to third FD node 526. Third transfer transistor 530 has its gate connected to a third transfer line TX<2>, which controls the charge transfer from third photodetector 528 to third FD node 526. Third reset transistor 534 has its drain coupled to third supply line HVDD<2> and its source coupled to third FD node 526. Third reset transistor 534 has its gate connected to a third reset line RST<2>, which controls the reset of third photodetector 528 and/or third FD node 526. Third SF transistor 535 has its gate coupled to third FD node 526, its source coupled to negative input 232 of comparator 230, and its drain coupled to bias line 520.

Ramp up line Rup<1> is placed adjacent to but insulated from third FD node 526 so the ramp up line is capacitively coupled to the third FD node. This capacitive coupling is represented by a capacitor 560 between ramp up line Rup<1> and third FD node 526. Ramp up line Rup<1> receives a ramp up signal from positive ramp generator 260 (FIG. 2).

Fourth APS pixel 524 includes a fourth FD node 536, a fourth photodetector 538, a fourth transfer transistor 540 that couples the fourth photodetector to the fourth FD node, a ramp down line Rdn<1> coupled to the fourth FD node, a fourth reset transistor 544 coupling a fourth supply line HVDD<3> to the fourth FD node, and a fourth SF transistor 545 that couples the fourth FD node to positive input 234 of comparator 230. Specifically, fourth transfer transistor 540 has its source coupled to the cathode of fourth photodetector 538 and its drain coupled to fourth FD node 536. Fourth transfer transistor 540 has its gate coupled to a fourth transfer line TX<3>, which controls the charge transfer from fourth photodetector 538 to fourth FD node 536. Fourth reset transistor 544 has its drain coupled to fourth supply line HVDD<3> and its source coupled to fourth FD node 536. Fourth reset transistor 544 has its gate coupled to a fourth reset line RST<3>, which controls the reset of fourth photodetector 538 and/or fourth FD node 536. Fourth SF transistor 545 has its gate coupled to fourth FD node 536, its source coupled to positive input 234 of comparator 230, and its drain coupled to bias line 520.

Ramp down line Rdn<1> is placed adjacent to but insulated from fourth FD node 536 so the ramp down line is capacitively coupled to the fourth FD node. This capacitive coupling is represented by a capacitor 562 between ramp down line Rdn<1> and fourth FD node 536. Ramp down line Rdn<1> receives a ramp down signal from negative ramp generator 262 (FIG. 2).

Column 502 includes a bias transistor 564 that biases SF transistors 516, 518, 535, and 545. Bias transistor 564 has its gate coupled to a line SF_BIAS, its drain coupled to bias line 520, and its source coupled to a negative power supply line.

Columns 504, 506, and 508 are arranged similarly to column 502. Columns 502, 504, 506, and 508 share lines SF_BIAS, RST<0>, HVDD<0>, TX<0>, Rup<0>, RST<1>, HVDD<1>, TX<1>, Rdn<0>, RST<2>, HVDD<2>, TX<2>, Rup<1>, RST<3>, HVDD<3>, TX<3>, and Rdn<1> that run across the rows. In particular, ramp up line Rup<0> is a horizontal line placed across the first row of pixels and adjacent to but insulated from the FD nodes in the first row so the ramp up line is capacitively coupled to these FD nodes. Ramp down line Rdn<0> is a horizontal line placed across the second row of pixels and adjacent to but insulated from the FD nodes in the second row so the ramp down line is capacitively coupled to these FD nodes. Ramp up line Rup<1> is a horizontal line placed across the third row of pixels and adjacent to but insulated from the FD nodes in the third row so the ramp up line is capacitively coupled to these FD nodes. Ramp down line Rdn<1> is a horizontal line placed across the fourth row of pixels and adjacent to but insulated from the FD nodes in the fourth row so the ramp down line is capacitively coupled to these FD nodes.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A pixel sensor, comprising:
    a first active pixel sensor pixel, comprising:
        a first floating diffusion node;
        a first photodetector coupled to the first diffusion node; and
        a first ramp line coupled to the first floating diffusion node;
    a second active pixel sensor pixel, comprising:
        a second floating diffusion node;
        a second photodetector coupled to the second diffusion node; and
        a second ramp line coupled to the second floating diffusion node;
    and
    a readout circuit, comprising:
        a comparator having a first input connected to the first floating diffusion node and a second input connected to the second floating diffusion node; and
        a latch coupled to the comparator.

2. The pixel sensor of claim 1, wherein the readout circuit further comprises:
    another comparator having a first input connected to a first output of the comparator, a second input connected to a second output of the comparator, and an output coupled to the latch.

3. The pixel sensor of claim 1, further comprising a counter coupled to the latch.

4. The pixel sensor of claim 1, further comprising a positive ramp generator and a negative ramp generator selectively coupled to the first and the second ramp lines.

5. The pixel sensor of claim 1, wherein the first ramp line is a horizontal line that travels along a first row of active pixel sensor pixels including the first active pixel sensor pixel, and the second ramp line is a second horizontal line that travels along a second row of active pixel sensor pixels including the second active pixel sensor pixel.

6. The pixel sensor of claim 1, wherein:
    the first active pixel sensor pixel further comprises a first transfer gate coupling the first photodetector to the first floating diffusion node and a first reset gate coupling the first floating diffusing node to a first supply rail; and
    the second active pixel sensor pixel further comprises a second transfer gate coupling the second photodetector to the second floating diffusion node and a second reset gate coupling the second floating diffusing node to a second supply rail.

* * * * *